(12) United States Patent
Agrawal et al.

(10) Patent No.: US 7,355,441 B1
(45) Date of Patent: Apr. 8, 2008

(54) PROGRAMMABLE LOGIC DEVICES WITH DISTRIBUTED MEMORY AND NON-VOLATILE MEMORY

(75) Inventors: Om P. Agrawal, Los Altos, CA (US); Brad Sharpe-Geisler, San Jose, CA (US); Jye-Yuh Lee, San Jose, CA (US); Bai Nguyen, Union City, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 94 days.

(21) Appl. No.: 11/360,337

(22) Filed: Feb. 22, 2006

(51) Int. Cl.
*H03K 19/173* (2006.01)
(52) U.S. Cl. .......................... 326/38; 326/41
(58) Field of Classification Search ............. 326/37–41
See application file for complete search history.

(56) References Cited

U.S. PATENT DOCUMENTS

| | | | | |
|---|---|---|---|---|
| 5,128,559 | A | * | 7/1992 | Steele .......................... 326/38 |
| 6,765,408 | B2 | * | 7/2004 | Cheng et al. .................. 326/41 |
| 6,828,823 | B1 | | 12/2004 | Tsui et al. |
| 7,111,110 | B1 | * | 9/2006 | Pedersen ..................... 711/104 |
| 7,190,190 | B1 | * | 3/2007 | Camarota et al. ............. 326/38 |
| 7,233,168 | B1 | * | 6/2007 | Simkins ........................ 326/38 |

OTHER PUBLICATIONS

XILINX®, Sparatan-3E FPGA Family: Complete Data Sheet, Advance Product Specification, DS312 Nov. 23, 2005, 110 pages.

Lattice Semiconductor Corporation, LatticeECP/EC Family Data Sheet, Version 01.4, Dec. 2004, 148 pages.

Altera®, Section 1. Cyclone II Device Family Data Sheet, Cyclone II Device Handbook, vol. 1, Nov. 2005, 86 pages.

* cited by examiner

*Primary Examiner*—Don Le
(74) *Attorney, Agent, or Firm*—MacPherson Kwok Chen & Heid LLP; Greg J. Michelson

(57) ABSTRACT

Systems and methods are disclosed herein in accordance with one or more embodiments of the present invention to provide programmable logic devices with non-volatile memory and a variable amount of distributed memory (e.g., in a cost-effective manner). For example, in accordance with an embodiment of the present invention, a programmable logic device includes a plurality of input/output blocks providing an input/output interface for the programmable logic device and a first and second plurality of logic blocks providing programmable logic functions, with only the second plurality of logic blocks further adapted to provide random access memory functions. A routing structure programmably interconnects the input/output blocks and the first and second plurality of logic blocks. Configuration memory cells store configuration data to configure the input/output blocks, the first and second plurality of logic blocks, and the routing structure, with at least one block of non-volatile memory to store configuration data that can be transferred to the configuration memory cells.

20 Claims, 4 Drawing Sheets

US 7,355,441 B1

PROGRAMMABLE LOGIC DEVICES WITH DISTRIBUTED MEMORY AND NON-VOLATILE MEMORY

TECHNICAL FIELD

The present invention relates generally to electrical circuits and, more particularly, to programmable logic device architectures with non-volatile memory and distributed memory.

BACKGROUND

Programmable logic devices (e.g., field programmable gate arrays (FPGAs)) are used in a wide variety of applications. A typical programmable logic device (PLD) includes a plurality of logic blocks that can be programmed to perform desired functions. The PLD may also include embedded blocks of volatile memory (e.g., block SRAM) to provide, for example, temporary storage during operation or to store a large amount of data during configuration that may be used by the logic during normal operation.

One drawback of a conventional PLD is that the embedded blocks of volatile memory may not be sufficient in some respect for a desired application and may lead to routing congestion. Consequently, some conventional PLDs also allow the SRAM forming the individual lookup tables (LUTs) within the logic blocks of the PLD to be used as memory, a technique commonly referred to as distributed memory (i.e., using the LUT memory within the homogenous logic blocks that are distributed throughout the PLD rather than using a few large volatile memory blocks as with the embedded blocks of volatile memory).

However, the conventional distributed memory approach often results in unused circuitry and resources for the typical application and limited flexibility in terms of selecting the desired amount of available distributed memory for a given application. Furthermore, the process of programming the distributed memory using an external bitstream is often undesired for certain applications. As a result, there is a need for improved memory techniques for programmable logic devices.

SUMMARY

In accordance with one embodiment of the present invention, a programmable logic device includes a plurality of input/output blocks adapted to provide an input/output interface for the programmable logic device; a first and second plurality of logic blocks adapted to provide programmable logic functions, wherein only the second plurality of logic blocks is further adapted to provide random access memory functions; a routing structure adapted to programmably interconnect the input/output blocks and the first and second plurality of logic blocks; configuration memory cells adapted to store configuration data to configure the input/output blocks, the first and second plurality of logic blocks, and the routing structure; and at least one block of non-volatile memory adapted to store configuration data for transfer to the configuration memory cells.

In accordance with another embodiment of the present invention, a programmable logic device includes a first means for providing programmable logic functions, wherein the first providing means is distributed within a first plurality of rows and does not provide random access memory functions; a second means for providing programmable logic functions and random access memory functions, wherein the second providing means is distributed within a second plurality of rows; means for storing configuration data for configuring the first and second providing means; and a second means for storing in a non-volatile manner configuration data to transfer to the configuration data storing means to configure the first and second providing means.

In accordance with another embodiment of the present invention, a method of providing distributed memory within a programmable logic device includes providing an input/output interface for the programmable logic device; providing a first and second set of logic blocks adapted to perform logic functions, wherein only the second set of logic blocks is further adapted to provide distributed memory functions; providing non-volatile memory within the programmable logic device for storing configuration data that is transferable to configuration memory to configure the input/output interface and the first and second set of logic blocks; and configuring the input/output interface and the first and second set of logic blocks.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
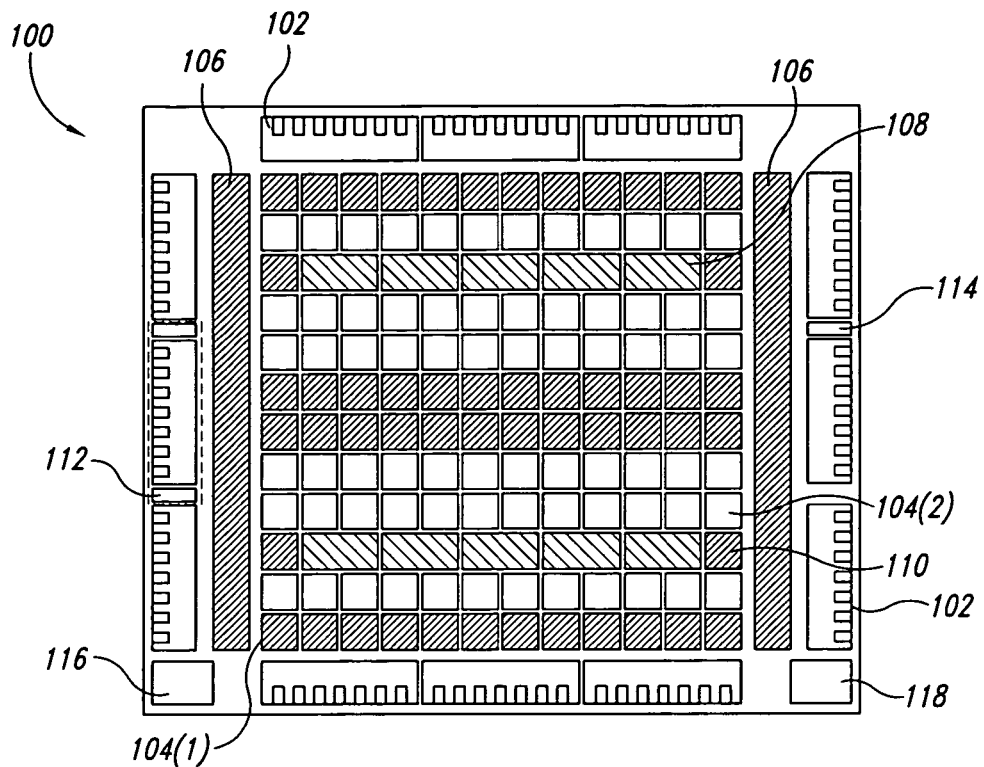
FIG. 1 shows a block diagram illustrating an exemplary programmable logic device in accordance with an embodiment of the present invention.

FIG. 1 shows a block diagram illustrating an exemplary programmable logic device (PLD) 100 in accordance with an embodiment of the present invention. PLD 100 includes input/output (I/O) blocks 102 and programmable logic blocks 104. I/O blocks 102 are used to provide I/O functionality (e.g., one or more I/O and/or memory interface standards) for PLD 100. Programmable logic blocks 104 are used to provide logic functionality (e.g., LUT-based logic) for PLD 100. As explained further herein, one or more of programmable logic blocks 104 are also used to provide memory functionality (e.g., distributed memory).

PLD 100 further includes one or more non-volatile memory 106 (e.g., EEPROM or flash memory), configuration memory 116, and a routing structure 118. Routing structure 118 (e.g., vertical and horizontal routing channel resources) provides programmable routing resources within PLD 100. Configuration memory 116 (e.g., SRAM cells or other types of volatile or non-volatile memory) are used to store configuration data for PLD 100, which determines the operation and functions of PLD 100. Configuration memory 116 also provides the memory (e.g., SRAM cells) that are used as the LUTs within programmable logic blocks 104.

Although shown in block form, it would be understood by one skilled in the art that configuration memory 116 and routing structure 118, for example, would typically be distributed throughout PLD 100 in a conventional fashion. Furthermore, it would be understood that PLD 100 is an exemplary functional representation of a PLD in accordance with one or more embodiments of the present invention, and that the placement and number of elements of PLD 100 may vary depending upon the desired application.

Non-volatile memory 106 is used to store configuration data (along with optionally other data) within PLD 100, with the configuration data internally transferable to configuration memory 116 to configure PLD 100. For example, non-volatile memory 106 may be used to store configuration data within PLD 100 for transfer to configuration memory 116 (including the LUTs within programmable logic blocks 104) of PLD 100 upon power up or during reconfiguration of PLD 100. This may drastically reduce the time to reconfigure PLD 100 relative to an external bitstream (e.g., reduce the time from seconds to microseconds for loading of configuration data into the configuration memory).

PLD 100 may also include one or more volatile memory 108 (e.g., block SRAM), clock-related circuitry 110 (e.g., PLL circuits), and data ports 112 and/or 114. Data ports 112 and 114, for example, may be used for programming PLD 100 (e.g., non-volatile memory 106 and/or configuration memory 116). For example, data port 112 may represent a programming port such as a central processing unit (CPU) port, also referred to as a peripheral data port or a sysCON-FIG programming port. Data port 114 may represent, for example, a programming port such as a joint test action group (JTAG) port by employing standards such as Institute of Electrical and Electronics Engineers (IEEE) 1149.1 or 1532 standards.

As noted, programmable logic blocks 104 provide logic functionality, such as for example in a conventional fashion for LUT-based logic that may provide logic, arithmetic, register functions, and/or other conventional LUT-based logic block functionality. However, only certain ones of programmable logic blocks 104 also provide SRAM functionality to provide distributed memory capability in addition to providing the logic functionality. Consequently, programmable logic blocks 104 (which are separately referenced as programmable logic blocks 104(1) and 104(2)) would provide logic functionality, but not every programmable logic block 104 also provides SRAM functionality.

For example, programmable logic blocks 104(1) (e.g., programmable logic blocks 104 with hatching in FIG. 1) provide logic functionality and SRAM functionality, while programmable logic blocks 104(2) (e.g., programmable logic blocks 104 without hatching in FIG. 1) provide logic functionality but not SRAM functionality. As shown in FIG. 1, PLD 100 includes four rows of programmable logic blocks 104(1) and six rows of programmable logic blocks 104(2) to provide, as an example, forty percent of programmable logic blocks 104 with distributed memory capability. However, this is merely exemplary as any desired percentage of programmable logic blocks 104(1) may be implemented for programmable logic blocks 104.

As further examples, FIGS. 2a-2f show block diagrams illustrating exemplary distributed memory architectures for PLD 100 of FIG. 1 in accordance with one or more embodiments of the present invention. Specifically, FIGS. 2a-2f illustrate exemplary distributed memory implementations for programmable logic blocks 104(1) relative to programmable logic blocks 104(2) and to optional volatile memory 108.

It should be noted that the term "rows" (also referred to herein as "stripes") is used in a generic fashion and may refer to rows, columns, diagonals or any other sequential arrangement of programmable logic blocks 104. It should also be understood that programmable logic blocks 104(1) are not limited to complete rows, as in accordance with one or more embodiments of the present invention programmable logic blocks 104(1) may be implemented for a portion of a row, alternate in any desired fashion within a row with programmable logic blocks 104(2), or may be implemented individually or in groups in any desired fashion throughout PLD 100. Furthermore, routing structure 118 may be generic from row to row throughout PLD 100 and does not have to differ due to the row or rows having programmable logic blocks 104(1) or 104(2).

Figure 2A:
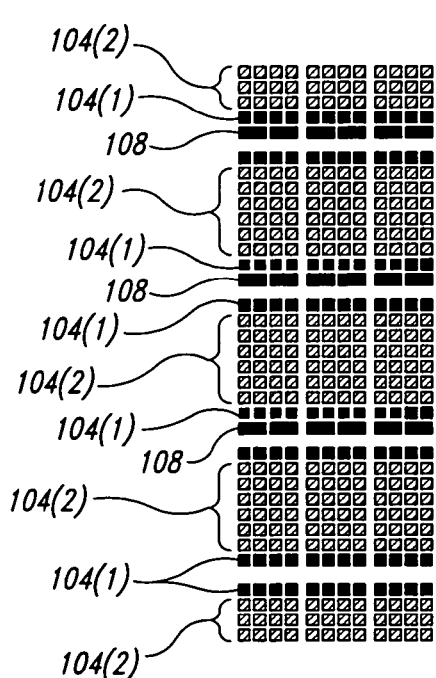
FIGS. 2a-2f show block diagrams illustrating exemplary distributed memory architectures for the programmable logic device of FIG. 1 in accordance with one or more embodiments of the present invention.
Figure 2B:
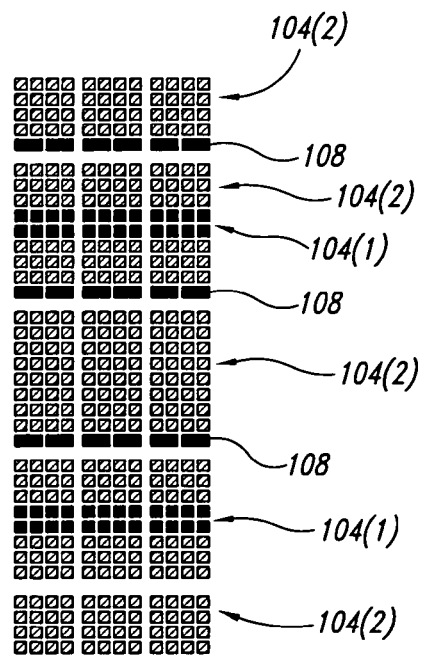

As shown in FIG. 2a, approximately one row of programmable logic blocks 104(1) are provided for every three rows of programmable logic blocks 104(2), which provides a fairly even distribution of programmable logic blocks 104(1) throughout PLD 100 and a distributed memory percentage of approximately 25%. FIG. 2b shows approximately one row of programmable logic blocks 104(1) for every seven rows of programmable logic blocks 104(2), which provide a fairly even distribution of programmable logic blocks 104(1) throughout PLD 100 and a distributed memory percentage of approximately 12.5%.

Figure 2C:
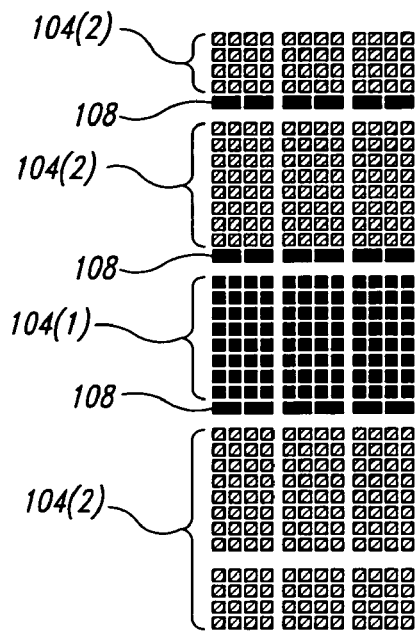
Figure 2D:
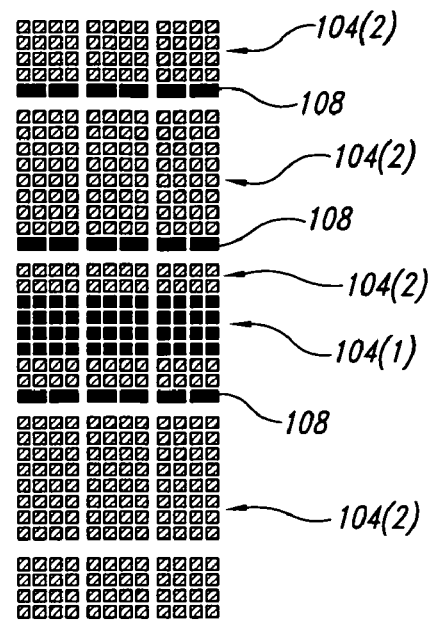
Figure 2E:
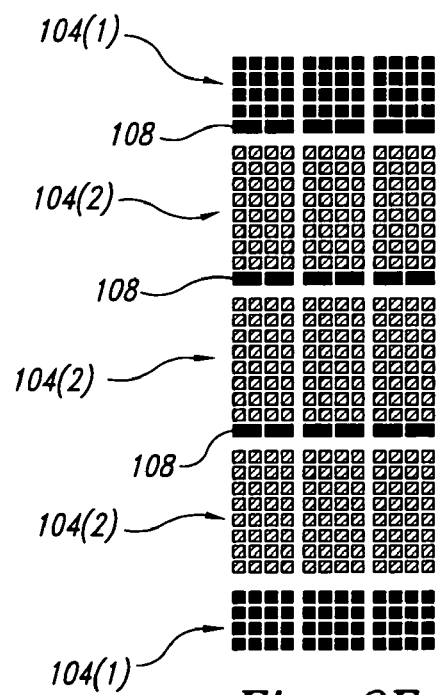
Figure 2F:
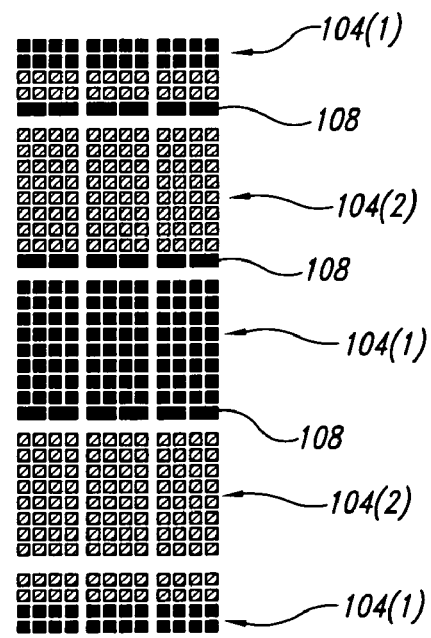

FIGS. 2c and 2d show programmable logic blocks 104(1) located centrally within PLD 100 (e.g., providing approximately 25% and 12.5% distributed memory, respectively, for these exemplary illustrations). FIGS. 2e and 2f show programmable logic blocks 104(1) located on the edges (FIG. 2e) and centrally and on the edges (FIG. 2f) within PLD 100 (e.g., providing approximately 25% and 37.5% distributed memory, respectively, for these exemplary illustrations).

In general, these exemplary implementations illustrate the flexibility in providing the desired amount of distributed memory and the ability to select the PLD with the optimal amount of distributed memory for a particular application. For example, the amount of distributed memory within a PLD can be different even within a family of PLD devices. Thus, in accordance with an embodiment of the present invention, the distributed memory functionality is decoupled from the homogeneous logic blocks to provide independent heterogeneous logic blocks that provide flexibility in adjusting the distributed memory based on, for example, the number of stripes implemented with distributed memory functionality. Furthermore, the techniques disclosed herein may decrease routing congestion and improve PLD performance.

Programmable logic blocks 104, implemented with a certain percentage (e.g., between 0 and 100%) having distributed memory capability, may provide certain advantages over conventional PLDs. For example, a conventional PLD may provide homogeneous logic blocks (e.g., with one or two types of slices per logic block) with no distributed memory capability or with all of the logic blocks providing distributed memory capability. However, if no distributed memory capability is provided, then typically additional SRAM blocks are provided, but the often desired feature of shallow and wide RAM capability of distributed memory is not available and the SRAM blocks may not be fully utilized. On the other hand, if all of the logic blocks provide distributed memory capability, these resources for the complete distributed memory capability are often underutilized and result in a waste of resources and fixed overhead and generally additional costs.

In contrast in accordance with one or more embodiments of the present invention, techniques are disclosed that provide a flexible (e.g., variable) allocation of distributed memory, with the amount and location of the distributed memory within the PLD selectable (e.g., within a family of PLDs) for the desired application. For example, a typical application may require 10 to 15% of programmable logic blocks 104 to have distributed memory capability. Therefore, a user may select a PLD implemented in accordance with an embodiment of the present invention that offers, for example, the desired 15% of programmable logic blocks 104 having distributed memory capability to meet the application requirements. If the user were to select a conventional PLD with 100% of the logic blocks having distributed memory capability, for example, it is clear that the unused distributed memory capability would generally result in a waste of resources and add to the cost in terms of price and size (i.e., die area). For low cost PLD applications, for example, it may be especially beneficial to optimize the die size overhead, including the distributed memory allocation.

Figure 3:
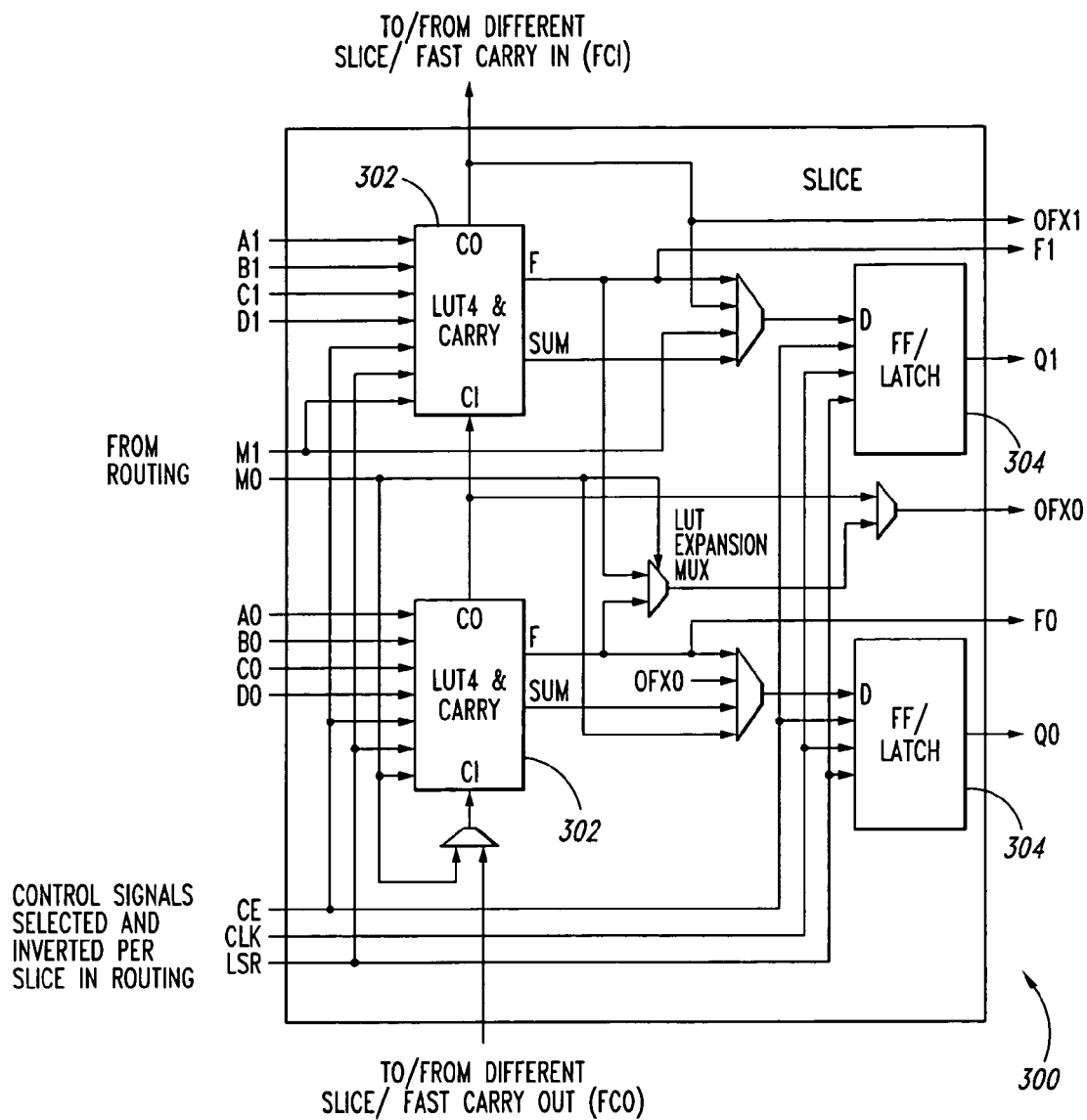
FIG. 3 shows a block diagram illustrating an exemplary logic block implementation for the programmable logic device of FIG. 1 in accordance with an embodiment of the present invention.

FIG. 3 shows a block diagram illustrating a portion of an exemplary logic block 300 for programmable logic block 104 of FIG. 1 in accordance with an embodiment of the present invention. The portion of logic block 300 (also referred to as a logic block slice) includes LUTs 302 and registers 304 and generally shows associated circuitry for various programmable modes or functions and programmable coupling within and to the routing resources (e.g., routing structure 118).

In general, logic block 300 or a conventional LUT-based logic block may be implemented for programmable logic block 104. However, logic block 300 for programmable logic block 104(1) differs from logic block 300 for programmable logic block 104(2) by the addition of RAM-associated circuitry (e.g., SRAM functionality), as would be understood by one skilled in the art.

Figure 4A:
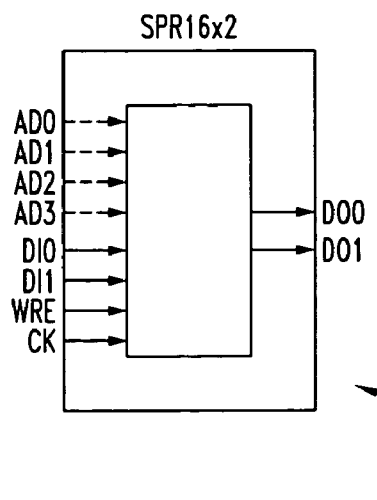
FIGS. 4a-4c show block diagrams illustrating exemplary distributed memory implementations for the logic block of FIG. 3 in accordance with one or more embodiments of the present invention.
Figure 4B:
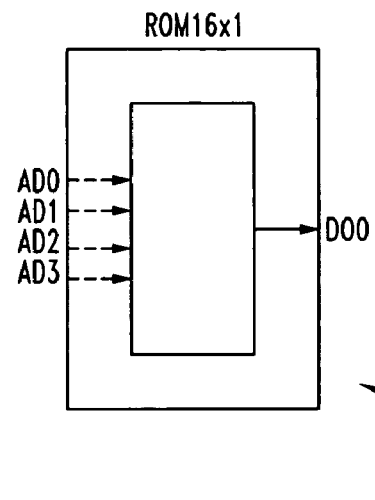
Figure 4C:
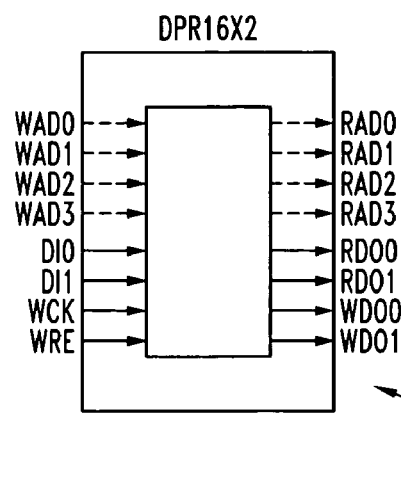

For example, FIGS. 4a-4c show block diagrams illustrating exemplary distributed memory implementations for logic block 300 of FIG. 3 implemented with the RAM-associated circuitry in accordance with one or more embodiments of the present invention (i.e., for programmable logic blocks 104(1)). Specifically, circuits 402, 404, and 406 (of FIGS. 4a, 4b, and 4c, respectively) illustrate exemplary block diagram distributed memory primitive implementations for logic block 300 to provide programmable logic block 104(1) with SRAM functionality.

Circuits 402 and 406 illustrate distributed RAM functionality in accordance with one or more embodiments of the present invention. For example, circuit 402 illustrates single port RAM (SPR) 16 by 2 bit memory that may be implemented within logic block 300, as would be understood by one skilled in the art. Circuit 406 illustrates dual port RAM (DPR) 16 by 2 bit memory that may be implemented by utilizing, for example, two logic blocks 300 (e.g., one as the read/write port and the other as the read port for the DPR), as would be understood by one skilled in the art. Circuit 404 illustrates the read only memory (ROM) mode for a 16 by 1 bit ROM, which uses the same principal as the RAM modes, but without the write port. For example, preloading may be performed during configuration of PLD 100.

Thus, in a conventional fashion for example, distributed RAM can be constructed using each LUT block (e.g., LUT 302) as a 16 by 1 memory. Furthermore, through the combination of LUTs and logic blocks 300 (e.g., slices), a variety of different memories can be constructed (e.g., by distributed memory primitives used by the PLD design software) as would be understood by one skilled in the art. For example, logic blocks 300 may be combined to form other sizes of SPR (e.g., 16 by 2 by 4, 16 by 4 by 2, or 16 by 8 by 1) and/or DPR (e.g., 16 by 2 by 2 or 16 by 4 by 1).

Systems and methods are disclosed herein in accordance with one or more embodiments of the present invention to provide programmable logic devices with a variable amount of distributed memory. For example, in accordance with an embodiment of the present invention, a PLD architecture is disclosed that offers an adjustable amount of distributed memory (e.g., variable amount for low cost FPGA applications).

As an example in accordance with an embodiment of the present invention, two types of logic blocks are arranged in stripes, with one type of logic block providing distributed memory capability while the other type of logic block does not provide distributed memory capability. The number of stripes for each type of logic block selected, therefore, will determine the percentage of distributed memory within the PLD. Thus, by adjusting the distribution of stripes, a desired percentage (e.g., ratio) of distributed memory capability may be provided for a PLD or for PLDs within a family (e.g., flexibility of adjusting the distributed memory percentage). The location of the stripes is also flexible to best suit the performance and routability requirements for a desired application. Consequently, heterogeneous logic blocks with adjustable amount of distributed memory (e.g., SRAM) capability may be provided, which may be especially beneficial, for example, for low cost FPGA architectures.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A programmable logic device comprising:
   a plurality of input/output blocks adapted to provide an input/output interface for the programmable logic device;
   a first and second plurality of logic blocks adapted to provide programmable logic functions, wherein each logic block includes two or more discrete lookup tables, and wherein only the second plurality of logic blocks is further adapted to provide distributed random access memory functions;
   a routing structure adapted to programmably interconnect the input/output blocks and the first and second plurality of logic blocks;
   configuration memory cells adapted to store configuration data to configure the input/output blocks, the first and second plurality of logic blocks, and the routing structure; and
   at least one block of non-volatile memory adapted to store configuration data for transfer to the configuration memory cells.

2. The programmable logic device of claim 1, wherein the logic functions comprise logic, arithmetic, and register operations, and wherein the random access memory functions provide distributed memory for at least one of single port memory and dual port memory.

3. The programmable logic device of claim 1, further comprising:

at least one block of volatile memory adapted to store data during operation of the programmable logic device;

a clock circuit adapted to provide at least one clock signal within the programmable logic device for the volatile memory; and wherein each of the logic blocks of the first and second plurality of logic blocks comprises two or more discrete four-bit lookup tables having associated registers.

4. The programmable logic device of claim 1, wherein the first plurality of logic blocks are arranged in a first plurality of rows and the second plurality of logic blocks are arranged in a second plurality of rows.

5. The programmable logic device of claim 1, wherein the first plurality of logic blocks are arranged in a first plurality of rows and the second plurality of logic blocks are arranged in a second plurality of rows, with the second plurality of rows located only centrally in contiguous rows between the first plurality of rows.

6. The programmable logic device of claim 1, wherein the first plurality of logic blocks are arranged in a first plurality of rows and the second plurality of logic blocks are arranged in a second plurality of rows, with the second plurality of rows located in contiguous rows, which include the first and last rows, with the first plurality of rows located centrally between the first and last rows of the second plurality of rows.

7. The programmable logic device of claim 1, wherein the first and second plurality of logic blocks provide a heterogeneous logic block architecture within the programmable logic device, and wherein the first plurality of logic blocks are arranged in a first plurality of rows and the second plurality of logic blocks are arranged in a second plurality of rows, with at least some of the second plurality of rows contiguous and disposed centrally between at least some of the first plurality of rows.

8. The programmable logic device of claim 1, wherein the programmable logic device comprises one of a number within a programmable logic device family providing varying percentages of distributed memory.

9. A programmable logic device comprising:

a first means for providing programmable logic functions, wherein the first providing means is distributed within a first plurality of rows and does not provide random access memory functions;

a second means for providing programmable logic functions and distributed random access memory functions, wherein the second providing means is distributed within a second plurality of rows;

means for storing configuration data for configuring the first and second providing means; and a second means for storing in a non-volatile manner configuration data to transfer to the configuration data storing means to configure the first and second providing means.

10. The programmable logic device of claim 9, further comprising:

means for providing an interface for the programmable logic device; and means for interconnecting the interface providing means with the first and second providing means.

11. The programmable logic device of claim 9, wherein only the second providing means provides random access memory functions, and wherein the first providing means only provides at least one of logic, arithmetic, and register operations.

12. The programmable logic device of claim 9, wherein the second plurality of rows are located only centrally in contiguous rows between the first plurality of rows.

13. The programmable logic device of claim 9, wherein the second plurality of rows are located in contiguous rows, which include the first and last rows, with the first plurality of rows located centrally between the first and last rows of the second plurality of rows.

14. The programmable logic device of claim 9, further comprising:

a second means for storing data during operation of the programmable logic device; and means for providing a clock signal for the programmable logic device.

15. The programmable logic device of claim 9, wherein the first and second providing means provide a heterogeneous logic block architecture within the programmable logic device, and wherein at least some of the second plurality of rows are contiguous and disposed at the edge of the first and second plurality of rows.

16. The programmable logic device of claim 9, wherein the programmable logic device comprises one of a number within a programmable logic device family providing varying percentages of distributed memory.

17. A method of providing distributed memory within a programmable logic devices the method comprising:

providing an input/output interface for the programmable logic device;

providing a first and second set of logic blocks adapted to perform logic functions, wherein the first set of logic blocks does not provide random access memory functions and only the second set of logic blocks is further adapted to provide distributed memory functions;

providing non-volatile memory within the programmable logic device for storing configuration data that is transferable to configuration memory to configure the input/output interface and the first and second set of logic blocks; and configuring the input/output interface and the first and second set of logic blocks.

18. The method of claim 17, further comprising providing a routing structure adapted to programmably interconnect the input/output interface and the first and second set of logic blocks, with the configuring further configuring the routing structure; and wherein the first set of logic blocks are arranged in a first plurality of rows and the second set of logic blocks are arranged in a second plurality of rows, with the second plurality of rows located in contiguous rows, which include the first and last rows, with the first plurality of rows located centrally between the first and last rows of the second plurality of rows.

19. The method of claim 17, wherein the logic functions comprise logic, arithmetic, and register operations, with the distributed memory functions providing random access memory, and wherein the first and second set of logic blocks provide a heterogeneous logic block architecture within the programmable logic device, and wherein each of the logic blocks of the second set provide two or more discrete n-bit lookup tables which provide the distributed memory functions.

20. The method of claim 17, wherein the first set of logic blocks are arranged in a first plurality of rows and the second set of logic blocks are arranged in a second plurality of rows, with at least some of the second plurality of rows arranged in contiguous rows.

* * * * *